United States Patent
Nagata et al.

(10) Patent No.: US 6,642,965 B1
(45) Date of Patent: Nov. 4, 2003

(54) SOLID-STATE IMAGE SENSING DEVICE WITH LIGHT-SHIELDING MEMBER HAVING OPENINGS SPACED AT AN EQUAL PITCH

(75) Inventors: Tsuyoshi Nagata, Tokyo (JP); Yasutaka Nakashiba, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/353,314

(22) Filed: Jul. 14, 1999

(30) Foreign Application Priority Data

Jul. 21, 1998 (JP) .......................................... 10-204886

(51) Int. Cl.[7] .............................................. H04N 5/225
(52) U.S. Cl. ...................... 348/340; 348/315; 250/208.1
(58) Field of Search ......................... 348/207.99, 218.1, 348/219.1, 222.1, 241, 251, 335, 340, 375, 315, 308, 300, 301, 302; 250/208.1

(56) References Cited

U.S. PATENT DOCUMENTS 5,734,155 A * 3/1998 Rostoker ................. 250/208.1
6,256,066 B1 * 7/2001 Yukawa et al. ............. 348/340

FOREIGN PATENT DOCUMENTS

| JP | 63-100879 | 5/1988 |
| JP | 6-204450 | 7/1994 |
| JP | 6-283694 | 10/1994 |
| JP | 9-46596 | 2/1997 |
| KR | 1999-0083635 | 11/1999 |

* cited by examiner

Primary Examiner—Tuan Ho
(74) Attorney, Agent, or Firm—McGinn & Gibb, PLLC (57) ABSTRACT

A solid-state image sensing device includes a plurality of photoelectric conversion cells, a light-shielding member, and a plurality of openings. The photoelectric conversion cells have photoelectric converters for photoelectrically converting optical signals and are arranged in a matrix to accumulate the photoelectrically converted signal charges. The photoelectric converters are adjacent to each other at different pitches in a predetermined direction. The light-shielding member covers the photoelectric conversion cells arranged in a matrix. The openings are formed in the light-shielding member in correspondence with the photoelectric converters, and pass optical signals to the photoelectric converters. The openings are arranged at an equal interval in a predetermined direction.

16 Claims, 7 Drawing Sheets

SOLID-STATE IMAGE SENSING DEVICE WITH LIGHT-SHIELDING MEMBER HAVING OPENINGS SPACED AT AN EQUAL PITCH

BACKGROUND OF THE INVENTION

The present invention relates to a solid-state image sensing device for receiving the optical image of an object formed on a light-receiving surface on which photoelectric converters are arranged in a matrix.

A solid-state image sensing device integrally comprises a group of pixels arranged in a matrix with a photoelectric conversion function and accumulation function, and a circuit having a scanning function of sequentially extracting, in time-series, signal charges accumulated in the respective pixels. As such a solid-state image sensing device, there is a MOS image sensing device (CMOS image sensor) having a CMOS (Complementary Metal Oxide Semiconductor) structure in which power consumption is low and peripheral circuits can be monolithically integrated.

Figure 4:
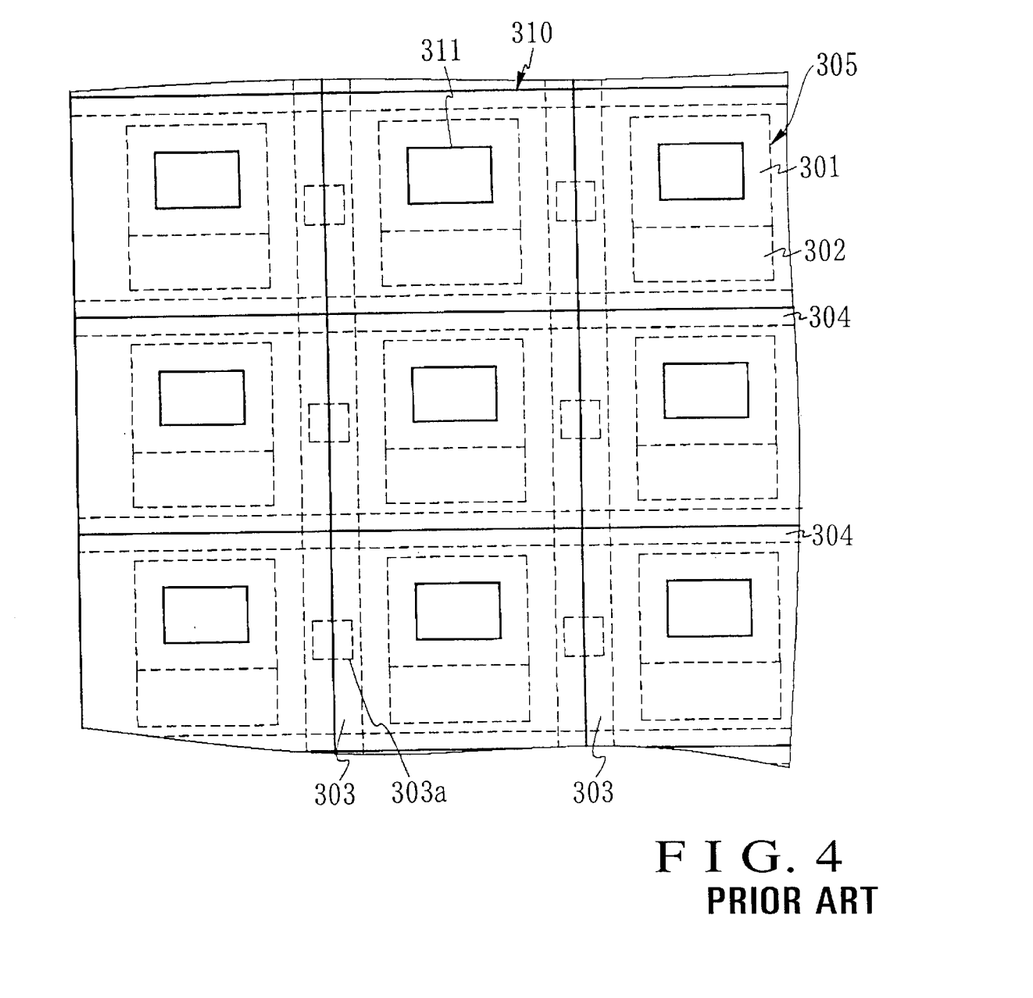
FIG. 4 is a plan view showing a conventional CMOS image sensor.

As shown in FIG. 4, this CMOS image sensor comprises a plurality of photoelectric converters 301 arranged in a matrix to perform photoelectric conversion and charge accumulation. Each photoelectric converter 301 is adjacent to a circuit region 302 for extracting signal charges. The photoelectric converter 301 and circuit region 302 constitute a photoelectric conversion cell 305.

A power supply line for supplying a power supply voltage or the like to the photoelectric converter 301 and circuit region 302 is laid in a Y-direction wiring region 303 between respective photoelectric conversion cells 305 adjacent in the X direction. A reset signal line for sending a reset signal to the photoelectric converter 301 and circuit region 302, a selection signal line, and the like are laid in an X-direction wiring region 304 between respective photoelectric conversion cells 305 adjacent in the Y direction. The circuit region 302 is connected to the power supply line via a contact 303a.

A light-shielding member 310 covers the respective photoelectric conversion cells 305 arranged in a matrix. Openings 311 are formed in the light-shielding member 310 at positions corresponding to the centers of the respective photoelectric converters 301.

The detailed circuit arrangement of the CMOS image sensor will be described with reference to FIG. 5.

As the photoelectric converter 301, a photodiode 401 is used. The photodiode 401 is made up of a p-type well formed in a silicon substrate, and an n-type impurity region formed from the surface of the silicon substrate in the well. When light is incident on the photodiode 401, electron-hole pairs are produced in the n-type impurity region. In the n-type impurity region, holes move to the p-type well, and only electrons are left. That is, charges are accumulated in the n-type impurity region of the photodiode 401 by irradiation of light. The accumulated charge amount changes depending on the intensity of incident light, and serves as signal charges.

A 1-pixel video signal by signal charges is amplified by a transistor 402 which receives a power supply voltage VDD via a power supply line 411. The transistor 402 is connected to the power supply line 411 via a contact 411a. The contact 411a corresponds to the contact 303a in FIG. 4.

The 1-pixel video signal is output from a signal output terminal 431 by selecting a transistor 403 by a signal from a vertical scanning shift register 421 and selecting a transistor 404 by a signal from a horizontal scanning shift register 422. When a reset signal is input to a transistor 405, the power supply voltage VDD is input to the photodiode 401 to erase the remaining charges.

Figure 5:
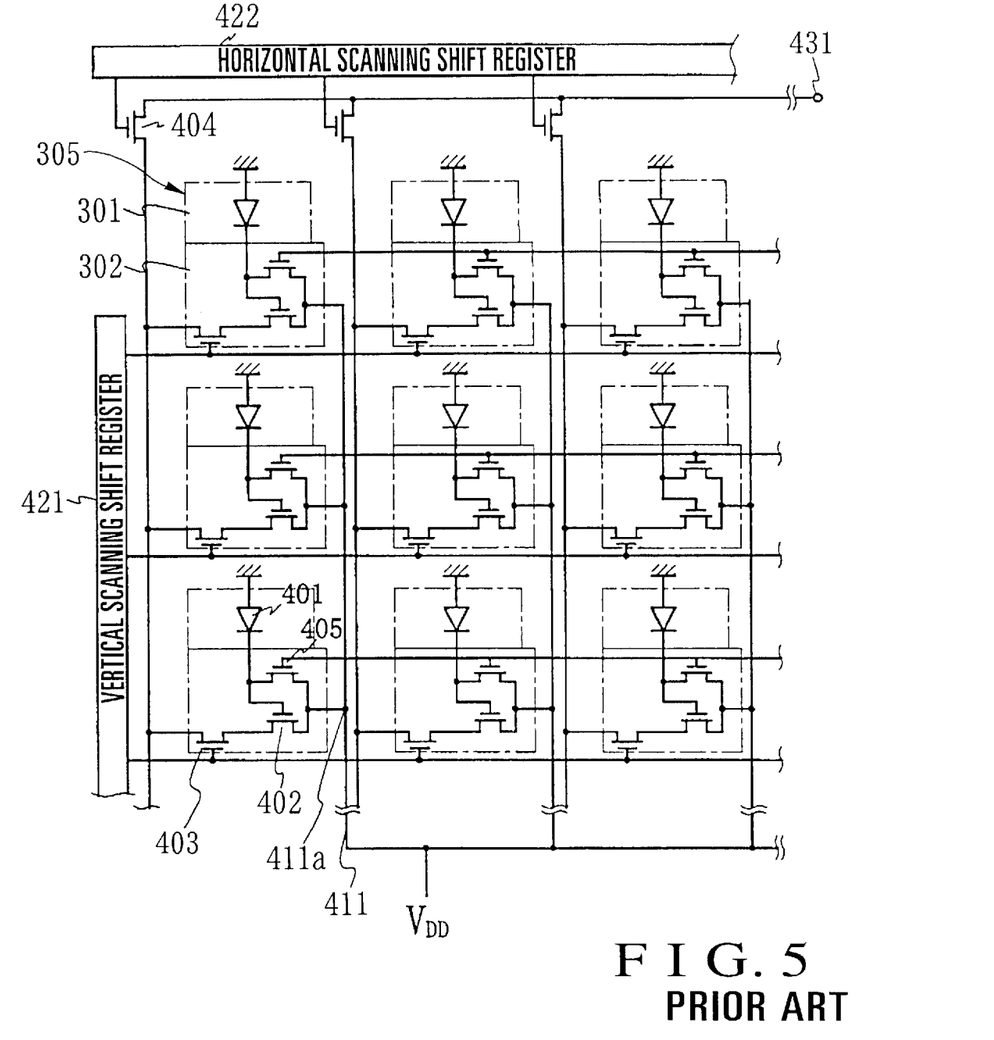
FIG. 5 is a circuit diagram showing the detailed arrangement of the CMOS image sensor in FIG. 3.

The transistors 402, 403, and 405 in FIG. 5 are formed in the circuit region 302 in FIG. 4. When light is incident on the circuit region 302, the transistors 402, 403, and 405 malfunction. To prevent this, the light-shielding member 310 (FIG. 4) covers the circuit region 302.

Video signals for respective pixels output from the photodiodes 401 arranged in a matrix and amplified by the transistors 402 are sequentially extracted as image signals by the vertical and horizontal scanning shift registers 421 and 422.

The photoelectric converter 301 and opening 311 shown in FIG. 4 cannot be excessively downsized in terms of reception of light. For example, the opening 311 cannot be excessively downsized in consideration of the wavelength of light to be received. For this reason, the characteristics of the CMOS image sensor degrade if the integration degree is increased by downsizing the photodiode of the photoelectric converter 301 and the opening 311.

Figure 6:
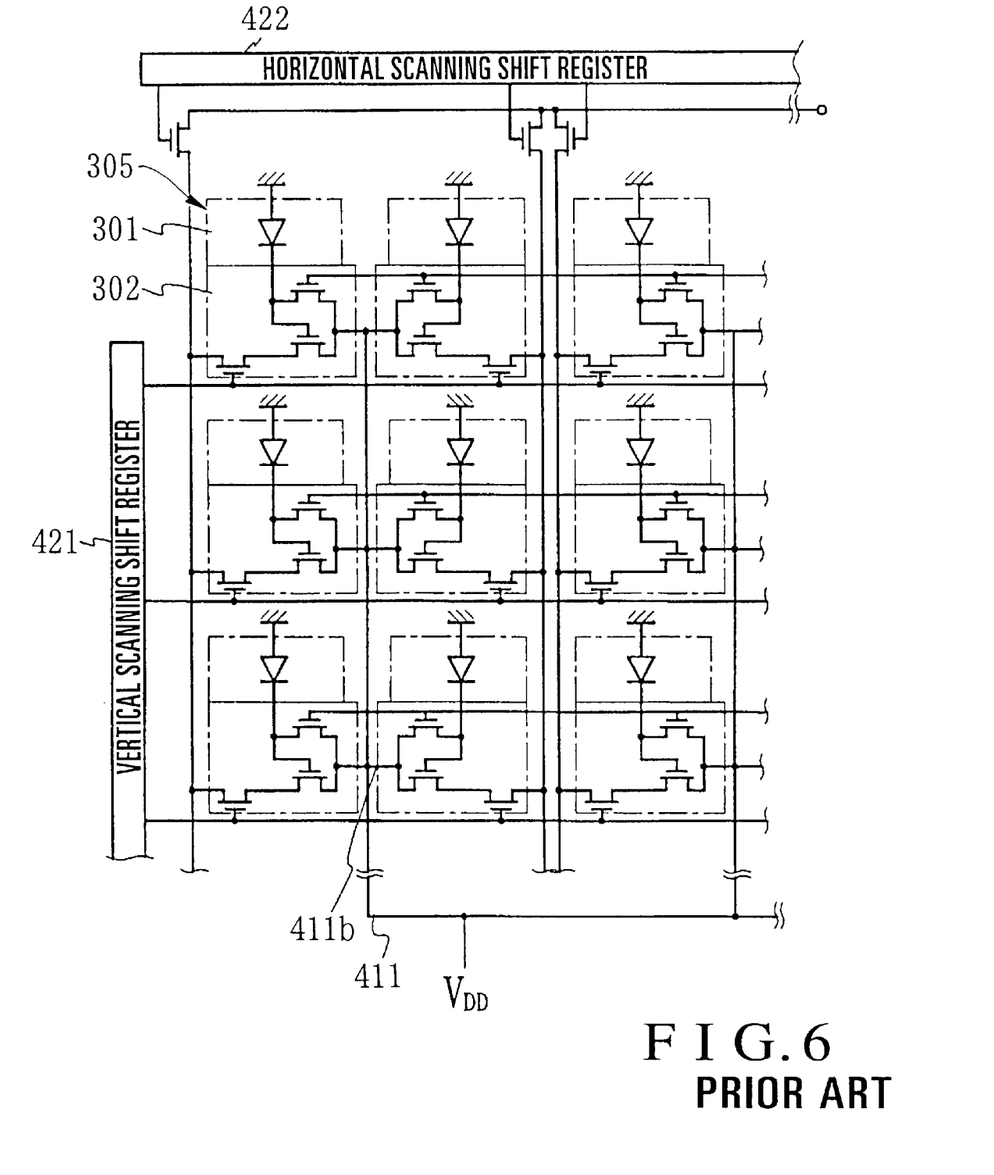
FIG. 6 is a circuit diagram showing the detailed arrangement of a conventional CMOS image sensor which achieves a high integration degree.
Figure 7:
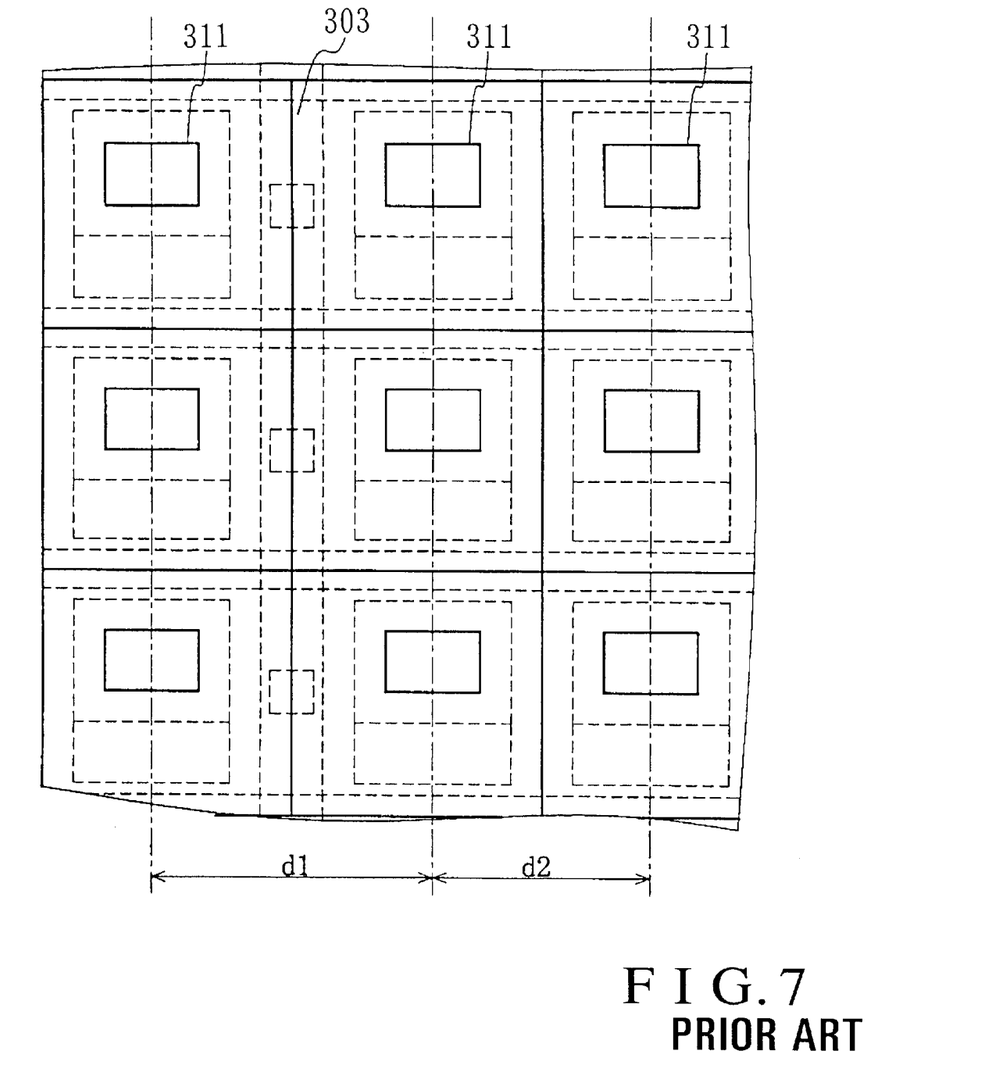
FIG. 7 is a plan view showing the CMOS image sensor in FIG. 6.

As shown in FIGS. 4 and 5, the power supply line for supplying the power supply voltage VDD need not be prepared for each of adjacent photoelectric conversion cells 305. That is, as shown in FIG. 6, one power supply line 411 is commonly used for photoelectric conversion cells 305 adjacent in the X direction, which can substantially halve the number of power supply lines 411. As a result, as shown in FIG. 7, the power supply line suffices to be arranged every other Y-direction wiring region 303, and the integration degree can increase. In this case, as shown in FIG. 6, circuit regions 302 adjacent in the X direction are connected to the power supply line 411 via a common contact 411b.

However, if the integration degree is increased by the above method, the pitches between the openings 311 of the photoelectric converters 301 in the X direction become different, and a reproduced image partially shifts from the optical position of an object.

More specifically, as shown in FIG. 7, a distance d1 between openings 311 adjacent in the X direction via the Y-direction wiring region 303 is different from a distance d2 between openings 311 directly adjacent without the mediacy of the Y-direction wiring region 303. However, pixels are arranged at an equal pitch in image reproduction, so an accurate image cannot be reproduced.

SUMMARY OF THE INVENTION

It is an object of the present invention to provide a solid-state image sensing device capable of obtaining a more accurate image reproduction state with a higher integration degree.

To achieve the above object, according to the present invention, there is provided a solid-state image sensing device comprising a plurality of photoelectric conversion cells which have photoelectric converters for photoelectrically converting optical signals and are arranged in a matrix to accumulate the photoelectrically converted signal charges, the photoelectric converters being adjacent to each other at different pitches in a predetermined direction, a light-shielding member which covers the photoelectric conversion cells arranged in a matrix, and a plurality of openings which are formed in the light-shielding member in correspondence with the photoelectric converters, and pass optical signals to the photoelectric converters, the openings being arranged at an equal interval in a predetermined direction.

DESCRIPTION OF THE PREFERRED EMBODIMENTS

The present invention will be described in detail below with reference to the accompanying drawings.

Figure 1:
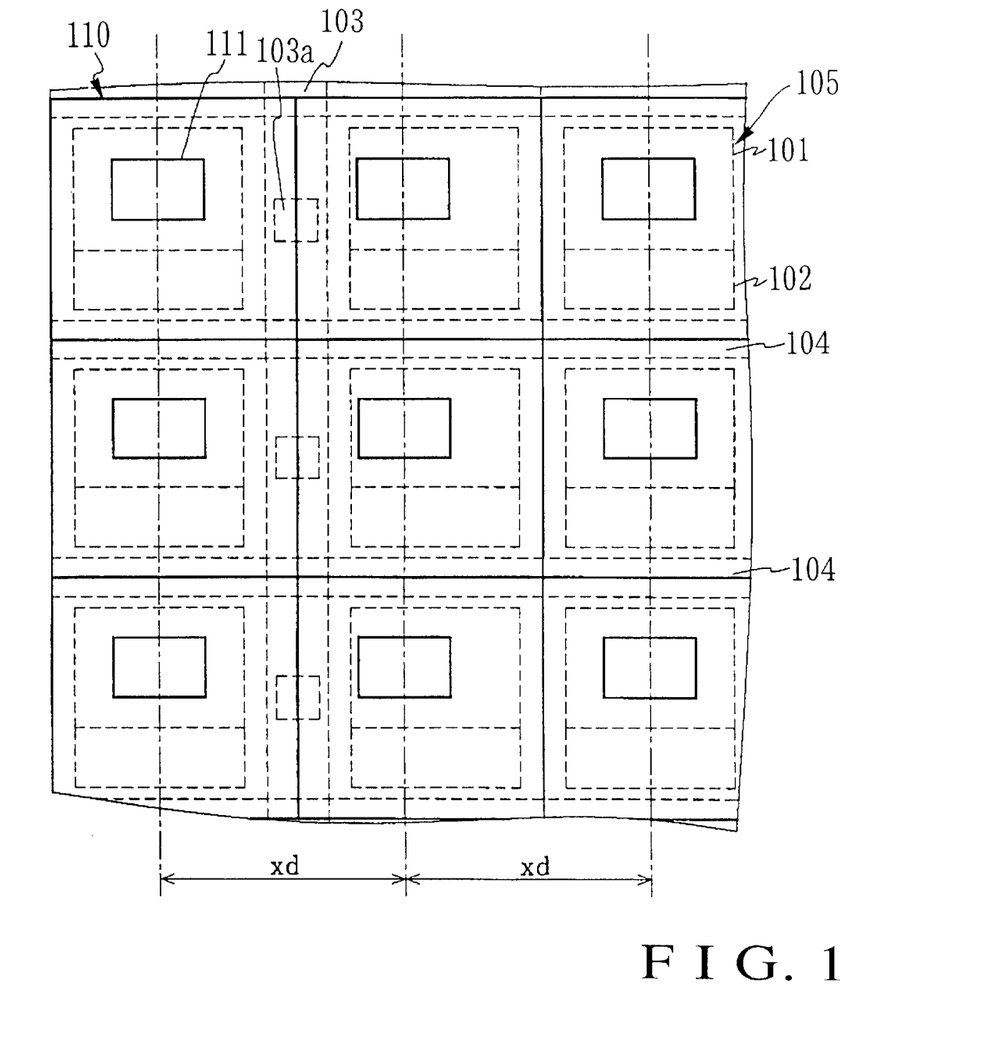
FIG. 1 is a plan view showing a CMOS image sensor according to the first embodiment of the present invention.

FIG. 1 shows a CMOS image sensor according to the first embodiment of the present invention. This CMOS image sensor has a light-receiving surface on which a plurality of photoelectric converters 101 for performing photoelectric conversion and charge accumulation are arranged in a matrix. On this light-receiving surface, each photoelectric converter 101 is adjacent to a circuit region 102 for extracting signal charges. The photoelectric converter 101 and circuit region 102 constitute a photoelectric conversion cell 105.

A power supply line (to be described later) for supplying a power supply voltage or the like to the photoelectric converter 101 and circuit region 102 is laid in a Y-direction wiring region 103 between respective photoelectric conversion cells 105 adjacent in the X direction. In the first embodiment, the Y-direction wiring region 103 is arranged every other column of the photoelectric conversion cells 105, and one power supply line is shared by photoelectric conversion cells 105 adjacent in the X direction. The resultant layout increases the integration degree. The circuit region 102 is connected to the power supply line via a contact 103a, and the contact 103a is commonly used for circuit regions 102 adjacent in the X direction.

A reset signal line (to be described below) for sending a reset signal to the photoelectric converter 101 and circuit region 102, a selection signal line (to be described below), and the like are laid in an X-direction wiring region 104 between respective photoelectric conversion cells 105 adjacent in the Y direction.

A light-shielding member 110 covers the respective photoelectric conversion cells 105 arranged in a matrix. Openings 111 are formed in the light-shielding member 110 at positions corresponding to the centers of the respective photoelectric converters 101. In the first embodiment, the openings 111 are arranged at an equal pitch in the X and Y directions.

Since the Y-direction wiring region 103 is arranged every other column of the photoelectric conversion cells 105, the pitches between the photoelectric converters 101 in the X direction are different, as is apparent from FIG. 1. Thus, the openings 111 are formed not at positions corresponding to the centers of the photoelectric converters 101, unlike the prior art, but at an equal pitch in regions corresponding to the photoelectric converters 101. That is, as shown in FIG. 1, when an opening 111 is formed in correspondence with the center of one of photoelectric converters 101 adjacent via the Y-direction wiring region 103, another opening 111 is formed in correspondence with a position of the other adjacent photoelectric converter 101 closer to the Y-direction wiring region 103.

Figure 2:
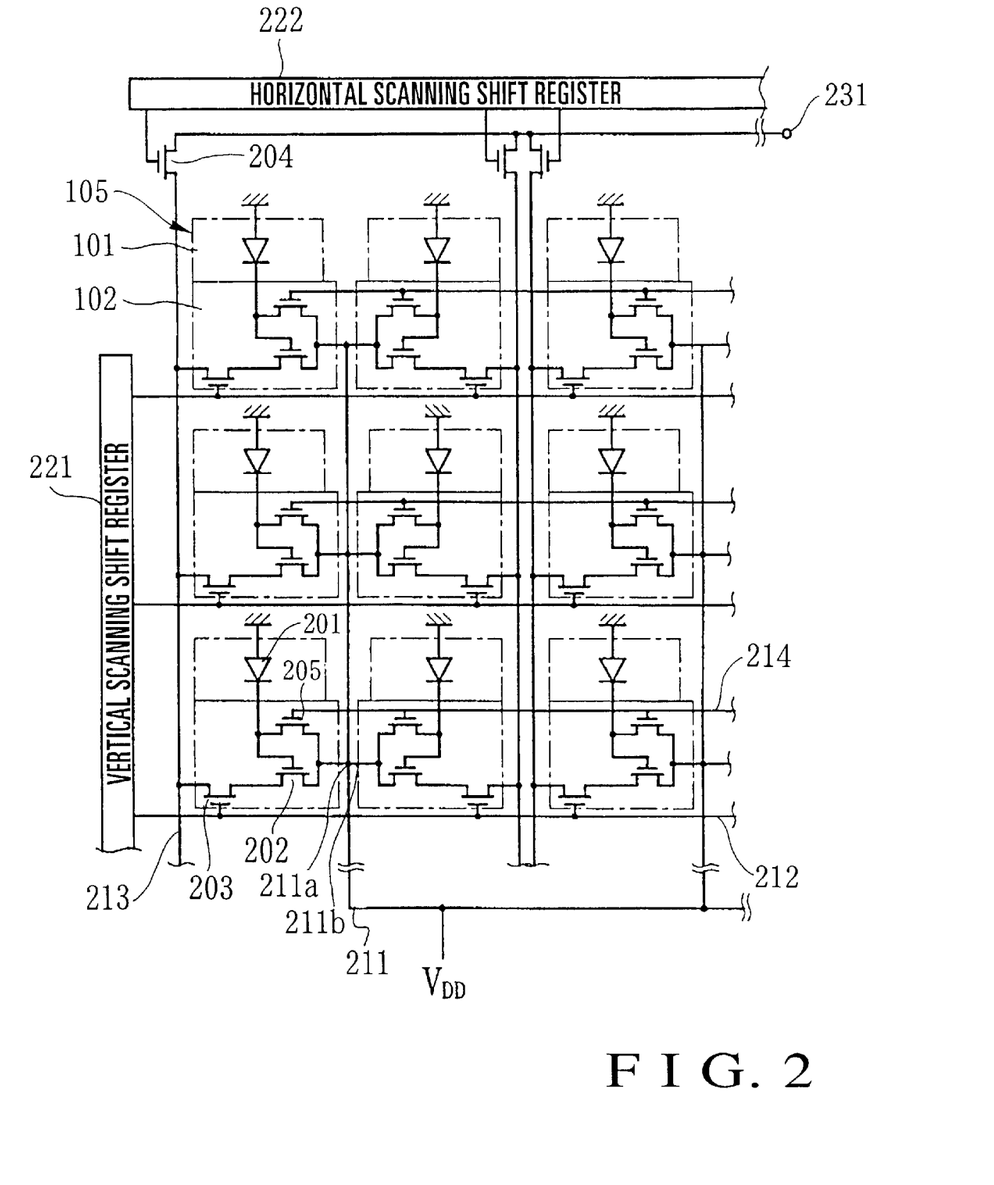
FIG. 2 is a circuit diagram showing the detailed arrangement of the CMOS image sensor in FIG. 1.

The detailed circuit arrangement of the CMOS image sensor will be described with reference to FIG. 2. Note that the circuit arrangement itself is the same as in FIG. 5, and only the main part will be explained in short.

A 1-pixel video signal by signal charges is amplified by a transistor 202 which receives a power supply voltage VDD via a power supply line 211. The transistor 202 is connected to the power supply line 211 via a contact 211a. The contact 211a corresponds to the contact 103a in FIG. 1.

A transistor 203 is selected by a signal from a vertical scanning shift register 221 via a selection signal line 212. A transistor 404 is selected by a signal from a horizontal scanning shift register 222 via a selection signal line 213. The 1-pixel video signal is output from a signal output terminal 231 by selecting these transistors 203 and 204. When a reset signal is input to a transistor 205 via a reset signal line 214, the power supply voltage VDD is input to a photodiode 201 to erase the remaining charges.

Video signals for respective pixels output from the photodiodes 201 arranged in a matrix and amplified by the transistors 202 are sequentially extracted as image signals by the vertical and horizontal scanning shift registers 221 and 222.

In the first embodiment, the distance between openings 111 adjacent in the X direction via the Y-direction wiring region 103, and the distance between openings 111 directly adjacent in the X direction without the mediacy of the Y-direction wiring region 103 are set equal to a pitch xd, as shown in FIG. 1. Since pixels are arranged at an equal pitch in image reproduction, an accurate image can be reproduced.

Note that the first embodiment increases the integration degree in the X direction by sharing the Y-direction wiring region 103 by photoelectric conversion cells 105 adjacent in only the X direction. However, the present invention is not limited to this.

Figure 3:
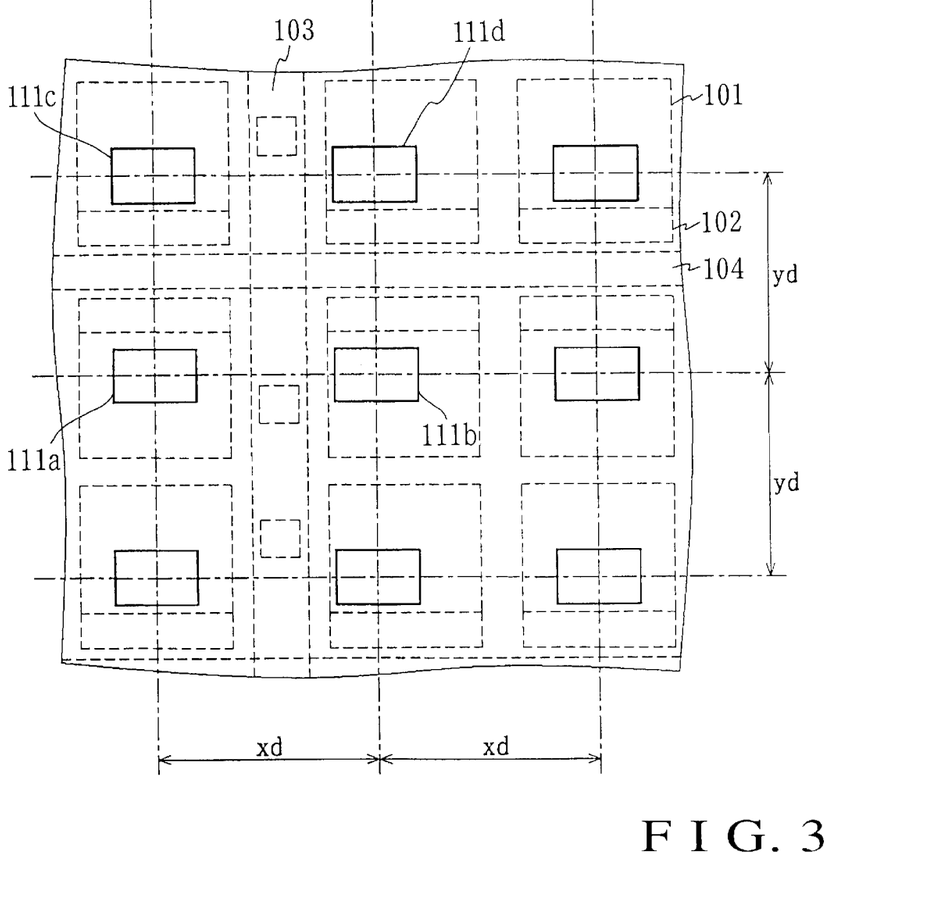
FIG. 3 is a plan view showing a CMOS image sensor according to the second embodiment of the present invention.

For example, as shown in FIG. 3, not only the Y-direction wiring region 103 but also the X-direction wiring region 104 may be shared by photoelectric conversion cells 105 adjacent in the Y direction, thereby increasing the integration degree. In this case, openings 111a and 111c (111b and 111d) are formed at an equal pitch yd in the Y direction, too. The openings 111a to 111d are formed within regions corresponding to the photoelectric converters 101.

More specifically, the first opening 111a among the first to fourth openings 111a to 111d which are arranged via crossed power supply lines and signal lines is formed in correspondence with the first position of the photoelectric converter 101. The second opening 111b is formed in correspondence with the second position of the photoelectric converter 101 closer to the power supply line 211 (Y-direction wiring region 103) than the first position. The third opening 111c is formed in correspondence with the third position of the photoelectric converter 101 closer to the signal lines 212 and 214 (X-direction wiring region 104) than the first position. The fourth opening 111d is formed in correspondence with the fourth position of the photoelectric converter 101 closer to the power supply line 211 and signal lines 212 and 214 than the first position.

As has been described above, according to the present invention, even when photoelectric converters adjacent in the X or Y direction are arranged at different pitches, openings formed above the photoelectric converters are arranged at an equal pitch. This layout can increase the integration degree of the photoelectric converters, and an image can be received while the image reproduction state more matches an original image.

What is claimed is:

1. A solid-state image sensing device comprising:
    a plurality of photoelectric conversion cells which have photoelectric converters for photoelectrically converting optical signals and are arranged in a matrix to accumulate photoelectrically converted signal charges, adjacent ones of said photoelectric converters being spaced from each other at different pitches in a predetermined direction;
    a light-shielding member which covers said photoelectric conversion cells; and
    a plurality of openings formed in said light-shielding member in correspondence with said photoelectric converters, the openings being spaced from each other at an equal interval in a predetermined direction, such that at least one of said plurality of openings is positioned offset from the center of a corresponding photoelectric converter.

2. A device according to claim 1, wherein said adjacent photoelectric converters are spaced from each other at different pitches in at least one of X and Y directions.

3. A device according to claim 1, wherein said adjacent photoelectric converters are spaced from each other at different pitches in both X and Y directions.

4. A device according to claim 1, wherein said device further comprises:
    power supply lines which are arranged between every other of said photoelectric conversion cells in an X direction, and extending in a Y direction; and
    signal lines which are arranged between adjacent photoelectric conversion cells in the Y direction, and extending in the X direction, and
        wherein said adjacent photoelectric converters are spaced from each other at different pitches in the X direction.

5. A device according to claim 4, wherein one of said openings which is adjacent to one of said power supply lines is formed in correspondence with a center of a corresponding photoelectric converter, and
    another of said openings which is adjacent to said power supply line is formed in correspondence with a position of a corresponding photoelectric converter closer to said power supply line than said one of said openings.

6. A device according to claim 1, wherein said device further comprises:
    power supply lines which are arranged between every other of said photoelectric conversion cells in an X direction, and extending in a Y direction; and
    signal lines which are arranged between every other of said photoelectric conversion cells in the Y direction, and extending in the X direction, and
        wherein adjacent photoelectric converters are spaced from each other at different pitches in the X and Y directions.

7. A device according to claim 6, wherein first, second, third, and fourth of said openings are formed adjacent a crossed power supply line and a signal line,
    the first opening being formed at a first position on a corresponding photoelectric converter,
    the second opening being positioned closer to said power supply line than the first position;
    the third opening being positioned closer to said signal line than the first position; and
    the fourth opening being positioned closer to said power supply line and said signal line than the first position.

8. A device according to claim 1, wherein each photoelectric conversion cell comprises a circuit portion for amplifying signal charges photoelectrically converted by each said photoelectric conversion cell, and
    wherein said circuit portion is covered with said light-shielding member to shield said circuit portion from light.

9. A solid-state image sensing device comprising:
    a plurality of photoelectric conversion cells arranged in a matrix and each comprising a photoelectric converter, said photoelectric converters being positioned at a varying pitch in a predetermined direction;
    a light-shielding member covering said photoelectric conversion cells; and
    a plurality of openings in said light-shielding member, each opening corresponding to a photoelectric converter, the openings being arranged at an equal pitch in said predetermined direction, such that at least one of said plurality of openings is offset from the center of a corresponding photoelectric converter.

10. The device of claim 9, wherein adjacent ones of said photoelectric converters are spaced at a varying pitch in one of X and Y directions.

11. The device of claim 9, wherein adjacent ones of said photoelectric converters are spaced at a varying pitch in both X and Y directions.

12. The device of claim 9, further comprising:
    a power supply line positioned between every other one of said photoelectric conversion cells in an X direction, and extending in a Y direction; and
    a signal line positioned between each of said photoelectric conversion cells in the Y direction, and extending in the X direction,
        wherein said photoelectric converters are positioned at a varying pitch in the X direction.

13. The device of claim 12, wherein another one of said openings adjacent to a power supply line is positioned in the center of a corresponding photoelectric converter.

14. The device of claim 9, further comprising:
    a power supply line positioned between a pair of said photoelectric conversion cells in an X direction, and extending in a Y direction; and
    a signal line positioned between a pair of said photoelectric conversion cells in the Y direction, and extending in the X direction, and
        wherein said photoelectric converters are positioned at a varying pitch in both of the X and Y directions.

15. The device of claim 14,
    wherein a first, second, third and fourth of said openings are each positioned in a quadrant adjacent a crossing of said power line and said signal line,
    wherein said first opening is spaced from each of said power line and said signal line,
    wherein said second opening is positioned adjacent to said first opening with said power line therebetween, spaced closer to said power line than said first opening and spaced equally from said signal line as said first opening,
    wherein said third opening is position adjacent to said first opening with said signal line therebetween, spaced closer to said signal line than said first opening and spaced equally from said power line as said first opening, and wherein said fourth opening is spaced closer to said power line and said signal line than said first opening.

16. The device of claim 9, wherein each photoelectric conversion cell comprises a circuit portion for amplifying signal charges photoelectrically converted by each said photoelectric conversion cell, wherein said circuit portion is covered with said light-shielding member to shield said circuit portion from light.

* * * * *